(12) United States Patent
Thomas et al.

(10) Patent No.: US 11,789,430 B2
(45) Date of Patent: Oct. 17, 2023

(54) METHOD OF STORING, PROCESSING, AND TRANSMITTING DIGITAL TWINS FOR FLEXIBLE MODULE PLATFORMS AND VEHICLES

(71) Applicant: Ford Global Technologies, LLC, Dearborn, MI (US)

(72) Inventors: Galen Keith Thomas, Dearborn, MI (US); Kerry Lance Paskell, Detroit, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 279 days.

(21) Appl. No.: 17/165,483

(22) Filed: Feb. 2, 2021

(65) Prior Publication Data

US 2021/0397164 A1    Dec. 23, 2021

Related U.S. Application Data

(63) Continuation-in-part of application No. 16/909,462, filed on Jun. 23, 2020.

(51) Int. Cl.
  *G05B 19/418* (2006.01)
  *G06T 7/00* (2017.01)
  *G06F 30/15* (2020.01)

(52) U.S. Cl.
  CPC ... *G05B 19/41805* (2013.01); *G05B 19/4183* (2013.01); *G05B 19/41865* (2013.01);
  (Continued)

(58) Field of Classification Search
  CPC ........ G05B 19/41885; G05B 19/41805; G05B 19/4183; G05B 19/41865; G06F 16/9554;
  (Continued)

(56) References Cited

U.S. PATENT DOCUMENTS 7,036,848 B2    5/2006  Chernoff et al.
11,132,479 B1 *  9/2021  Tyson, II ......... G05B 19/41805
(Continued)

FOREIGN PATENT DOCUMENTS

CN    109625092    4/2019

OTHER PUBLICATIONS

Wu et al., CN 106476933, "System For Assembling Automobile Chassis and Car Chassis Assembling Method", Feb. 19, 2019, 7 pgs <CN_106476933.pdf>.*
(Continued)

*Primary Examiner* — Tuan A Vu
(74) *Attorney, Agent, or Firm* — Burris Law, PLLC (57) ABSTRACT

A method for creating a digital twin for a vehicle assembled on at least one assembly line includes assembly of a modular vehicle subassembly (MVS) in a plurality of MVS assembly zones by assembling at least one component at each MVS assembly zone, scanning the at least one component at each MVS assembly zone and acquiring scanned data, and storing the scanned data in a MVS temporary digital file assigned to the pre-assembled MVS. The method also includes updating a MVS permanently digital file assigned to the pre-assembled MVS after the at least one component at each of the MVS assembly zones has been assembled and storing the MVS permanent digital file when assembly of the MVS is complete.

17 Claims, 7 Drawing Sheets

(52) U.S. Cl.
CPC ............ *G06F 30/15* (2020.01); *G06T 7/0004* (2013.01); *G05B 2219/31043* (2013.01); *G05B 2219/31044* (2013.01)

(58) Field of Classification Search
CPC  G06F 8/71; G06F 30/15; C25D 13/22; B62D 65/02; G06T 7/0004
See application file for complete search history.

(56) References Cited

U.S. PATENT DOCUMENTS

| | | | | |
|---|---|---|---|---|
| 2002/0198618 | A1* | 12/2002 | Madden | B62D 65/02 700/115 |
| 2014/0034487 | A1* | 2/2014 | Clifford | C25D 13/22 204/269 |
| 2014/0217166 | A1* | 8/2014 | Berthiaume | G06F 16/9554 235/375 |
| 2018/0275681 | A1 | 9/2018 | Gariepy et al. | |
| 2021/0138651 | A1* | 5/2021 | Mcgregor | G05B 19/41885 |
| 2021/0149655 | A1* | 5/2021 | Mathews | G06F 8/71 |

OTHER PUBLICATIONS

JP 5578837, "Automobile Assembly Equipment", Aug. 27, 2014, 8 pgs <JP_5578837.pdf>.*

* cited by examiner

METHOD OF STORING, PROCESSING, AND TRANSMITTING DIGITAL TWINS FOR FLEXIBLE MODULE PLATFORMS AND VEHICLES

CROSS-REFERENCE TO RELATED APPLICATIONS

This application claims the benefit of and is a continuation-in-part of U.S. patent application Ser. No. 16/909,462 filed on Jun. 23, 2020, which is commonly assigned with the present application. This application is also related to co-pending applications filed concurrently herewith titled "FLEXIBLE MODULAR PLATFORM", "METHOD OF VEHICLE ASSEMBLY INCLUDING MODULAR VEHICLE SUBASSEMBLY CONTROLS, COMMUNICATION AND MANUFACTURE", "FACILITY SENSORY SYSTEM FOR MONITORING, GUIDING, AND PROTECTING FLEXIBLE MODULAR PLATFORMS MOVING THROUGH AN ASSEMBLY LINE", and "FLEXIBLE MODULAR PLATFORM PLANT NAVIGATION SYSTEM", which are commonly assigned with the present application. The contents of these patent applications are incorporated herein by reference in their entireties.

FIELD

The present disclosure relates to vehicles and manufacturing of vehicles.

BACKGROUND

The statements in this section merely provide background information related to the present disclosure and may not constitute prior art.

Vehicles are typically manufactured in assembly plants designed and built to support a projected vehicle assembly volume based on mechanical infrastructure requirements needed to support manufacturing operations. And such mechanical infrastructure requirements typically include conveyer systems and/or automatic guided vehicle (AGV) based systems to move vehicle subassemblies from station to station along an assembly line. However, the time, investment and capital expenditure needed to build conveyer systems or to adapt AGVs for specific application tasks can be prohibitive.

These issues associated with assembly lines in vehicle assembly plants, among other issues related to manufacturing different product configurations in the same assembly facility, are addressed by the present disclosure.

SUMMARY

This section provides a general summary of the disclosure and is not a comprehensive disclosure of its full scope or all of its features.

In one form of the present disclosure, a method for creating a digital twin for a vehicle assembled on at least one assembly line includes the steps of: a) starting assembly of a pre-assembled modular vehicle subassembly (MVS) in a N=1 MVS assembly zone of an MVS assembly line having a plurality of MVS assembly zones by assembling Nth assembly zone components, or moving the pre-assembled MVS into the Nth MVS assembly zone and assembling Nth assembly zone components onto the pre-assembled MVS, wherein N=1, 2, 3, . . . Z1 and Z1 equals a total number of the plurality of MVS assembly zones; b) scanning at least one of the Nth assembly zone components and acquiring scanned data, and storing the scanned data in a MVS temporary digital file assigned to the pre-assembled MVS, wherein N=1, 2, 3, . . . Z1 and Z1 equals a total number of the plurality of MVS assembly zones; c) updating a MVS permanently digital file assigned to the pre-assembled MVS; d) incrementing N by 1; e) repeating steps a) through d) until N equals Z1 and the pre-assembled MVS is a MVS; and f) storing the MVS permanent digital file when N equals Z1.

In some variations, the method further includes scanning a vehicle identification number (VIN) for the pre-assembled MVS in the Nth MVS assembly zone. In such variations, the VIN for the pre-assembled MVS in the Nth MVS assembly zone can be scanned when the pre-assembled MVS moves into the Nth MVS assembly zone and scanned when the pre-assembled MVS moves out of the Nth MVS assembly zone.

In at least one variation, the method further includes creating the MVS temporary digital file before the pre-assembled MVS moves out of the N=1 MVS assembly zone.

In some variations, the method further includes creating the MVS permanent digital file before the pre-assembled MVS moves out of the N=1 MVS assembly zone.

In at least one variation, the method further includes scanning a vehicle identification number (VIN) of the pre-assembled MVS in the Nth MVS assembly zone before assembling the Nth assembly zone components onto the pre-assembled MVS and scanning the VIN of the pre-assembled MVS in the Nth MVS assembly zone after assembling the Nth assembly zone components onto the pre-assembled MVS.

In some variations, the MVS permanent digital file is updated after the Nth assembly zone components are assembled onto the pre-assembled MVS in the Nth assembly zone.

In at least one variation, the method further includes the steps of: f) moving the MVS into a Kth assembly zone of a top hot (TH) assembly line having a plurality of TH assembly zones and assembling Kth assembly zone components onto the MVS, scanning at least the Kth assembly zone components and acquiring TH scanned data, and storing the TH scanned data in a TH temporary digital file assigned to the MVS, wherein K=1, 2, 3, . . . Z2 and Z2 equals a total number of the plurality of TH assembly zones; g) updating a TH permanently digital file assigned to the MVS; h) incrementing K by 1; i) repeating steps f) through h) until K equals Z2 and the TH is assembled on the MVS and the vehicle is manufactured; and e) storing the TH permanent digital file when K equals Z2.

In some variations, the method further includes scanning a vehicle identification number (VIN) of the MVS in the Kth assembly zone before assembling the Kth assembly zone components onto the MVS and scanning the VIN of the MVS in the Kth assembly zone after assembling the Kth assembly zone components onto the MVS in the Kth assembly zone.

In some variations, the method further includes creating the TH temporary digital file before the MVS moves out of the K=1 TH assembly zone.

In at least one variation, the TH permanent digital file comprises the MVS permanent file updated with the TH scanned data. In such variations the MVS permanent file can be downloaded onto a central management system for the TH assembly line prior to being updated with the TH scanned data.

In some variations, the method further includes scanning a vehicle identification number (VIN) of the MVS in the Kth TH assembly zone before assembling the Kth assembly zone components onto the MVS and scanning the VIN of the MVS in the Kth TH assembly zone after assembling the Kth assembly zone components onto the MVS.

In at least one variation, the TH permanent digital file is updated after the Kth assembly zone components are assembled onto the MVS in the Kth assembly zone.

In some variations, the method further includes scanning a vehicle identification number (VIN) of the pre-assembled MVS in the Nth MVS assembly zone before assembling the Nth assembly zone components onto the pre-assembled MVS and scanning the VIN of the pre-assembled MVS in the Nth MVS assembly zone after assembling the Nth assembly zone components onto the pre-assembled MVS, and the steps of: f) moving the MVS into a Kth assembly zone of a top hot (TH) assembly line having a plurality of TH assembly zones and assembling Kth assembly zone components onto the MVS, scanning at least the Kth assembly zone components and acquiring TH scanned data, and storing the TH scanned data in a TH temporary digital file assigned to the MVS, wherein K=1, 2, 3, ... Z2 and Z2 equals a total number of the plurality of TH assembly zones; g) updating a TH permanently digital file assigned to the MVS; h) incrementing K by 1; i) repeating steps f) through h) until K equals Z2 and the TH is assembled on the MVS and the vehicle is manufactured; k) storing the TH permanent digital file when K equals Z2; and l) scanning the VIN of the MVS in the Kth assembly zone before assembling the Kth assembly zone components onto the MVS and scanning the VIN of the MVS in the Kth assembly zone after assembling the Kth assembly zone components onto the MVS in the Kth assembly zone.

In another form of the present disclosure, a method for creating a digital twin for a vehicle assembled on at least one assembly line includes the steps of: a) at least one of starting assembly of a pre-assembled modular vehicle subassembly (MVS) in a N=1 MVS assembly zone of an MVS assembly line having a plurality of MVS assembly zones by assembling Nth assembly zone components, and moving the pre-assembled MVS into the Nth MVS assembly zone assembling Nth assembly zone components onto the pre-assembled MVS, wherein N=1, 2, 3, ... Z1 and Z1 equals a total number of the plurality of MVS assembly zones; b) scanning at least one of the Nth assembly zone components and acquiring scanned data, and storing the scanned data in a MVS temporary digital file assigned to the pre-assembled MVS, wherein N=1, 2, 3, ... Z1 and Z1 equals a total number of the plurality of MVS assembly zones; c) updating a MVS permanently digital file assigned to the pre-assembled MVS; d) incrementing N by 1; e) repeating steps a) through d) until N equals Z1 and the pre-assembled MVS is a MVS; f) storing the MVS permanent digital file when N equals Z1; g) moving the MVS into a Kth assembly zone of a top hot (TH) assembly line having a plurality of TH assembly zones and assembling Kth assembly zone components onto the MVS, scanning at least the Kth assembly zone components and acquiring TH scanned data, and storing the TH scanned data in a TH temporary digital file assigned to the MVS, wherein K=1, 2, 3, ... Z2 and Z2 equals a total number of the plurality of TH assembly zones; h) updating a TH permanently digital file assigned to the MVS; i) incrementing K by 1; j) repeating steps g) through i) until K equals Z2 and the TH is assembled on the MVS and the vehicle is manufactured; and k) storing the TH permanent digital file when K equals Z2.

In some variations, the method further includes creating the MVS temporary digital file before the pre-assembled MVS moves out of the N=1 MVS assembly zone, creating the MVS permanent digital file before the pre-assembled MVS moves out of the N=1 MVS assembly zone, creating the TH temporary digital file before the MVS moves out of the K=1 TH assembly zone, downloading the MVS permanent digital file onto a central management system for the TH assembly line, and updating the MVS permanent digital file with the TH scanned data.

In at least one variation, the scanned data comprises transient data of the pre-assembled MVS, the transient data comprising at least one of is at least one of performance data of the MVS, at least one trouble code of the MVS, assembly testing data of the MVS, and over-the-air programming information of the MVS.

In still another form of the present disclosure, a method is provided for creating a digital twin for a vehicle being assembled by moving assembled components of the vehicle through N=1, 2, 3, ... Z1 modular vehicle subassembly (MVS) assembly zones, where Z1 equals a total number of the MVS assembly zones on a MVS assembly line. The method includes the steps of: a) scanning a vehicle identification number (VIN) for a pre-assembled MVS in an Nth assembly zone; b) creating a MVS temporary digital file for the pre-assembled MVS when N=1; c) scanning Nth assembly zone components and acquiring MVS component scanned data; d) assembling the Nth assembly zone components onto the pre-assembled MVS in the Nth assembly zone; e) updating the MVS temporary digital file with the MVS component scanned data; f) scanning the VIN, moving the pre-assembled MVS out of the Nth assembly zone, and creating a MVS permanent digital file for the MVS being assembled when N=1; g) updating the MVS permanent digital file with the MVS component scanned data; h) incrementing N by 1; i) repeating steps a) through h) until N equals Z1 and the pre-assembled MVS is a MVS; and j) storing the MVS permanent digital file when N=Z1.

In some variations, the method further includes the steps of: k) moving the MVS into a Kth assembly zone of a top hot (TH) assembly line having a plurality of TH assembly zones and assembling Kth assembly zone components onto the MVS, scanning at least the Kth assembly zone components and acquiring TH scanned data, and storing the TH scanned data in a TH temporary digital file assigned to the MVS, wherein K=1, 2, 3, ... Z2 and Z2 equals a total number of the plurality of TH assembly zones; l) scanning the VIN and retrieving the MVS permanent digital file; m) moving the assembled MVS into a Kth assembly zone and creating a TH temporary digital file for the TH being assembled on the MVS when K=1; n) assembling TH components onto the MVS in the Kth assembly zone, wherein the TH components are scanned; o) updating the TH temporary digital file such that data on the scanned TH components and the TH being assembled are stored in the TH temporary digital file; p) scanning the VIN, moving the TH being assembled out of the Kth assembly zone, and creating a TH permanent digital file for the TH being assembled when N=1; q) updating the TH permanent digital file with the stored data in the TH temporary digital file; r) incrementing K=K+1 when K is less than Z2 and moving the MVS being assembled into a subsequent Kth assembly zone, wherein Z2 equals a total number of the TH assembly zones on the TH assembly line; s) repeating steps k) through r) until K equals Z2 and the TH is assembled on the MVS; and t) updating and storing the TH plus MVS permanent digital file when K=Z2.

Further areas of applicability will become apparent from the description provided herein. It should be understood that the description and specific examples are intended for purposes of illustration only and are not intended to limit the scope of the present disclosure.

DRAWINGS

In order that the disclosure may be well understood, there will now be described various forms thereof, given by way of example, reference being made to the accompanying drawings, in which.

The drawings described herein are for illustration purposes only and are not intended to limit the scope of the present disclosure in any way.

DETAILED DESCRIPTION

The following description is merely exemplary in nature and is not intended to limit the present disclosure, application, or uses. It should be understood that throughout the drawings, corresponding reference numerals indicate like or corresponding parts and features.

The present disclosure provides a system and method for creating, storing, transferring and using digital twins of modular vehicle subassemblies (MVSs, also known as "flexible modular platforms") and vehicles. As used herein, the phrase "digital twin" refers to a real time digital replica of a MVS and/or a completely assembled vehicle, e.g., a MVS with a top hat assembled thereon. It should be understood that a digital twin is a real mapping of some or all of the components of a MVS and/or a completely assembled vehicle.

Figure 1:
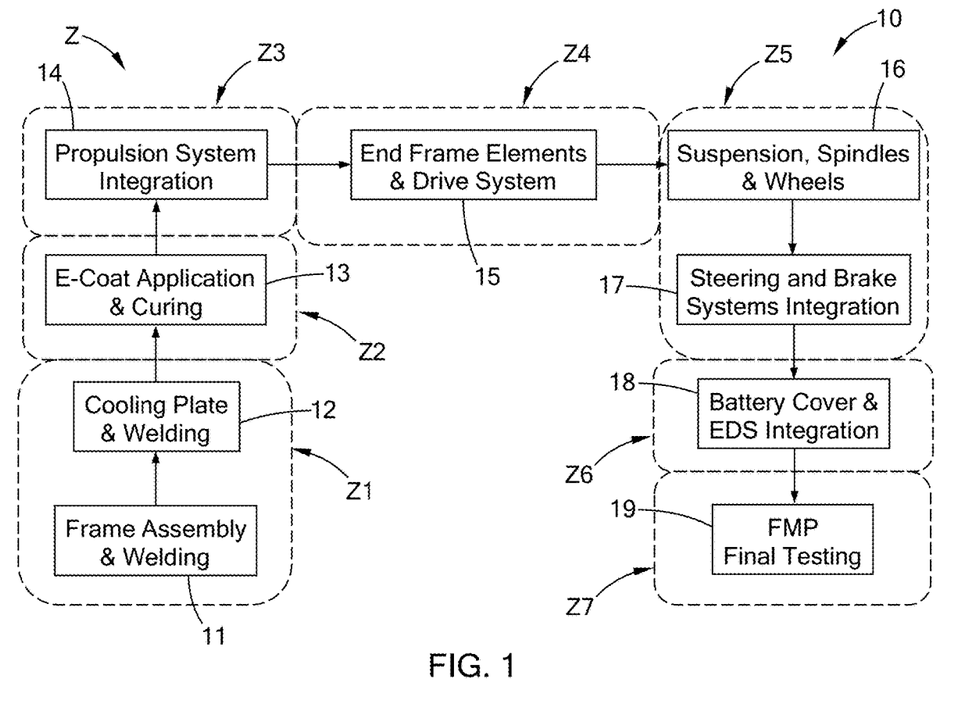
FIG. 1 is flow chart for a method of manufacturing a modular vehicle subassembly (MVS) and a block diagram for assembly zones in a MVS assembly facility according to the teachings of the present disclosure.

Referring to FIG. 1, one example of a method 10 of manufacturing a MVS 100 (FIG. 3) in a MVS assembly facility 'Z' during which a digital twin of the MVS 100 is created is shown (creating the digital twin of the MVS 100 is described in greater detail below with respect to FIG. 5). Also, the dotted outlines labeled 'Z1-Z7' in FIG. 1 represent non-limiting examples of assembly zones in the MVS assembly facility Z and FIGS. 2A-2F show various stages of assembly of the MVS 100 is shown in FIGS. 2A-2F.

Figure 2A:
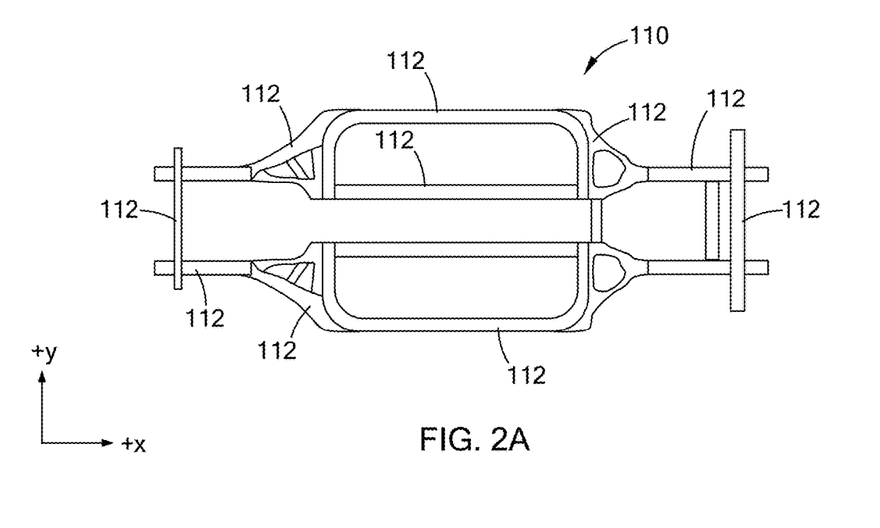
FIG. 2A shows a frame assembled from a plurality of frame components according to the teachings of the present disclosure.
Figure 2B:
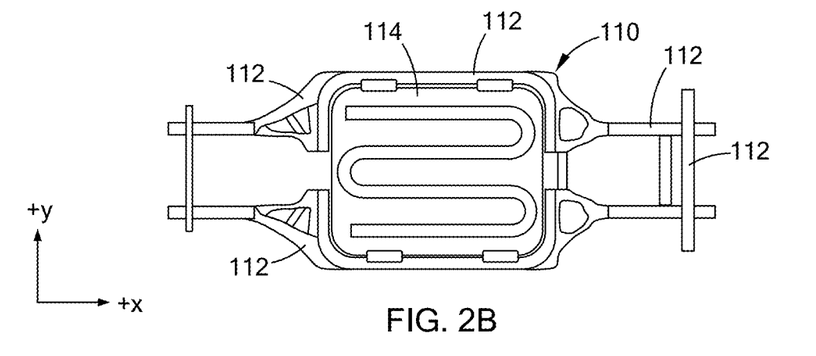
FIG. 2B shows a cooling plate assembled onto the frame shown in FIG. 2A according to the teachings of the present disclosure.

With reference to FIGS. 1 and 2A-2B, the method 10 includes assembling a plurality of frame components 112 to form a frame 110 (FIG. 2A) at 11 in assembly zone Z1, and in some variations a cooling plate 114 (FIG. 2B) is also assembled onto the frame 110 at 12, e.g., in assembly zone Z1. In some variations the plurality of frames components 112 are welded together to form the frame 110 and the cooling plate 114 is welded to the frame 110. In other variations one or more of the frame components 112 and/or cooling plate 114 are joined together with fasteners such as bolts, screws, and rivets, among others. A protective coating, e.g., an E-coating, is applied to and cured on the frame 110 and cooling plate 114 (if included) at 13 in assembly zone Z2.

Figure 2C:
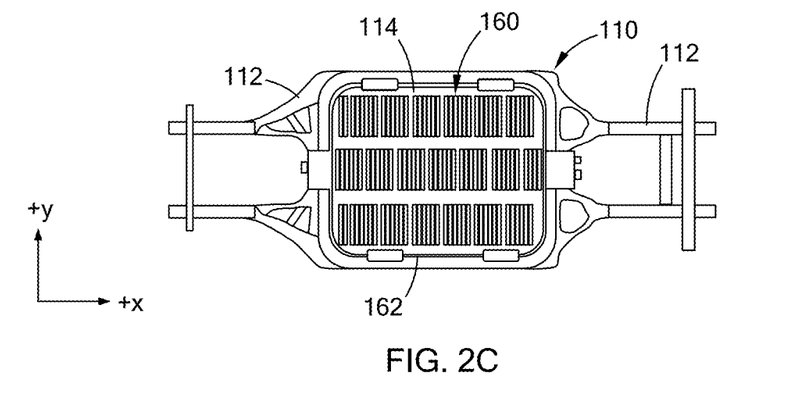
FIG. 2C shows a propulsion system installed and integrated with the frame shown in FIG. 2A according to the teachings of the present disclosure.
Figure 2D:
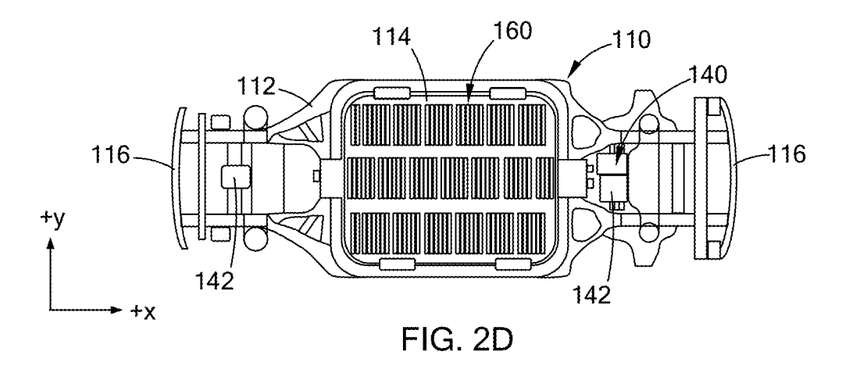
FIG. 2D shows end frame components and a drive system assembled onto the frame shown in FIG. 2A according to the teachings of the present disclosure.
Figure 2E:
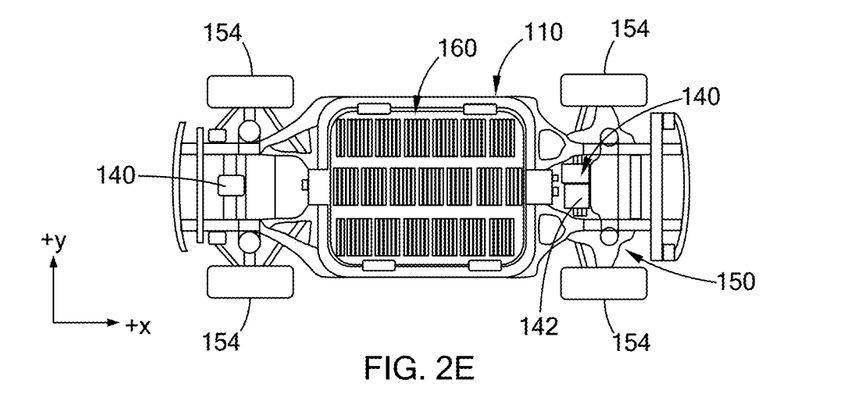
FIG. 2E shows a suspension system assembled onto the frame shown in FIG. 2A according to the teachings of the present disclosure.
Figure 2F:
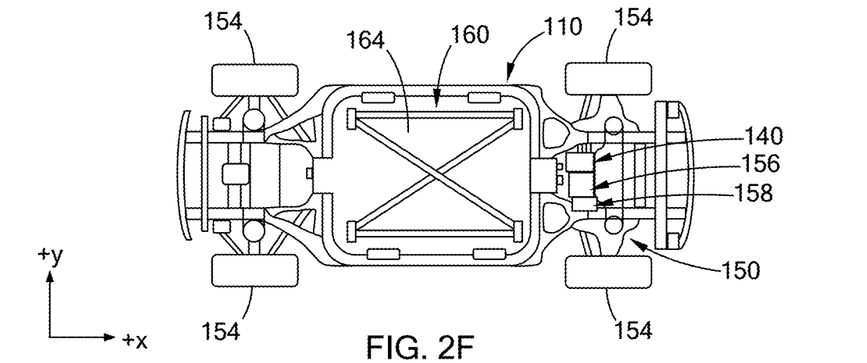
FIG. 2F shows a battery cover and an electrical distribution system installed and integrated the frame and other components shown in FIGS. 2A-2E according to the teachings of the present disclosure.

Referring to FIGS. 1 and 2C, a propulsion system 160 is installed and integrated with the frame 110 at 14 in assembly zone Z3. In some variations the propulsion system 160 is a battery propulsion system with a plurality of electric batteries 162. End frame elements 116 and a drive system 140 (FIG. 2D) are assembled onto the frame 110 at 15 in assembly zone Z4. And in at least one variation the end frame elements 116 include bumper supports and the drive system 140 includes one or more electric motors 142 integrated with the propulsion system 160.

A suspension system 150 including shock absorbers (not labeled), spindles (not labeled), and wheels 154 (with tires, FIG. 2E) are assembled onto the frame 110 at 16 in assembly zone Z5. And a steering system 156 and a braking system 158 (FIG. 2E) are installed and integrated with the suspension system 150 at 17 in assembly zone Z5. In some variations the braking system 158 is an integrated braking system with the drive system 140 and/or electric motors 142. In the alternative, or in addition to, the braking system 158 is a traditional disc type braking system coupled to the wheels 154. A battery cover 164 (FIG. 2F) and an electrical distribution system (EDS) (not labeled) are installed and integrated with the above mentioned components at 18 in assembly zone Z6 such that assembly of the MVS 100 is provided and the MVS 100 is subjected to MVS final testing at 19 in assembly zone Z7.

Figure 3:
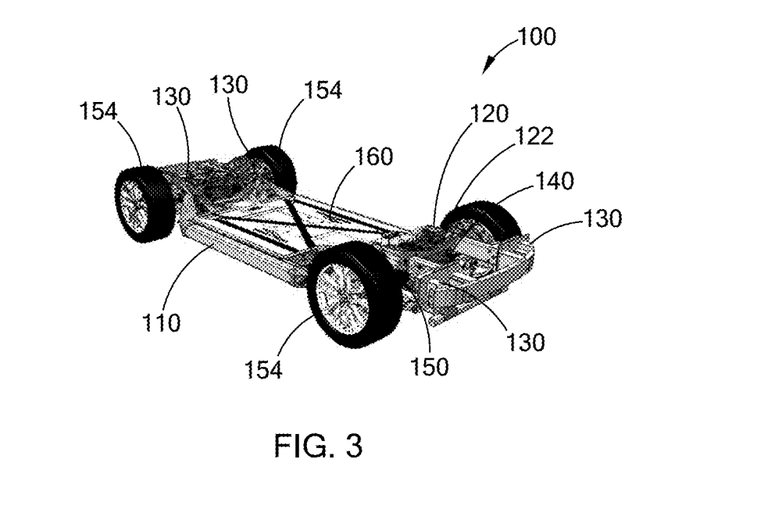
FIG. 3 is a perspective view of an assembled modular vehicle subassembly according to the teachings of the present disclosure.

Referring to FIG. 3, in some variations the method 10 includes installing an onboard controller 120 and one or more transient data sensors 130 (e.g., installed at 18) integrated with the onboard controller 120. In at least one variation the onboard controller 120 is a stand along unit, while in other variations the onboard controller is integrated within a computer cluster 124 of the MVS 100. As used herein, the phrase "stand-alone unit" refers to a physically separate unit or controller. In at least one variation the onboard controller 120 includes an onboard communications link 122. As used herein, the phrase "communication link" refers to a communication channel that connects two or more devices for the purpose of data transmission. In at least one variation the onboard communications link 122 is a wireless communications link with a wireless signal receiver/transmitter that includes an antenna.

In addition to assembling the various components discussed above, in some variations a digital twin of each assembled MVS 100 is created during and upon completion of each MVS 100 as described in greater detail below.

Figure 4:
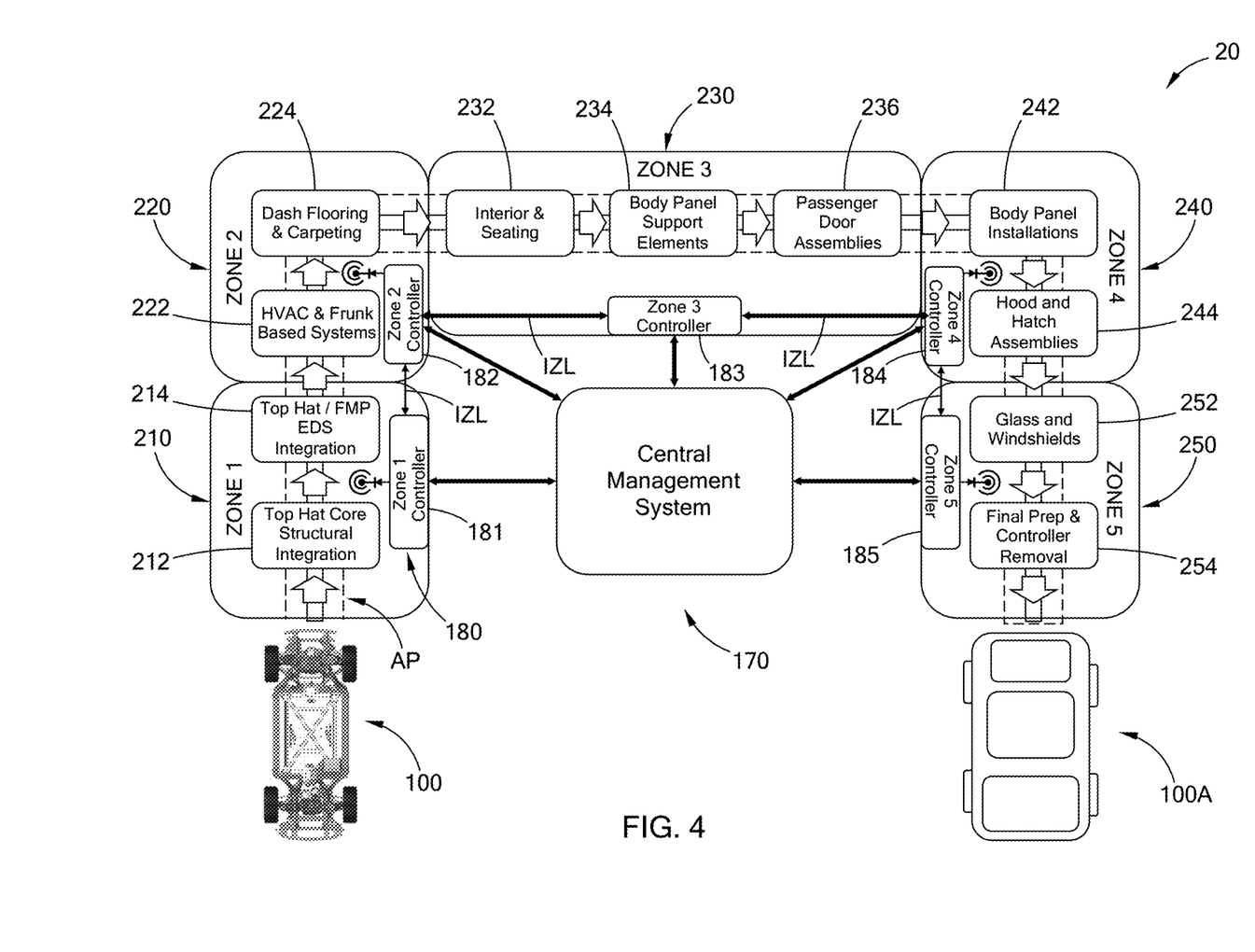
FIG. 4 shows a system for remote controlling a plurality of modular vehicle subassemblies through a plurality of zones and providing a fully assembled vehicle according to the teachings of the present disclosure.

Referring to FIG. 4, one example of a vehicle assembly facility 20 for assembling top hats onto a plurality of MVSs 100 such that vehicles 100A are manufactured, and during which a digital twin for each of vehicles 100A is created, is shown (creating the digital twin of the vehicle 100A 100 is described in greater detail below with respect to FIG. 6). The vehicle assembly facility 20 and the plurality of MVSs 100 (only one MVS 100 shown for clarity) are configured to move the plurality of MVSs 100 through five assembly zones 210, 220, 230, 240, 250 along an assembly path AP via remote control and using power provided by each MVS 100. That is, the plurality of MVSs 100 move through the vehicle assembly facility 20 under remote control and under their own power.

The vehicle assembly facility 20 includes a central management system 170 and a zone management system 180. For the example shown in FIG. 4, the zone management system 180 has five zone controllers 181, 182, 183, 184, 185 for the five zones 210, 220, . . . 250 and each of five zone controllers 181, 182, . . . 185 are in communication with adjacent zone controllers via interzone links 'IZL'. The central management system 170 controls the movement of the MVSs 100 remotely through assembly zones 210, 220, . . . 250 and assembly stations within each assembly zone. Non-limiting examples of assembly stations within the assembly zones 210, 220, . . . 250 include a top hat core structural integration station 212 and a top hat/MVS engine data scan (EDS) integration station 214 in assembly zone 210, a heating, venting, and air conditioning (HVAC) and a trunk/frunk based system station 222, and a dash, flooring and carpet station 224 in assembly zone 220, an interior and seating station 232, a body panel support elements station 234, and a passenger door assembly station 236 in assembly zone 230, a body panels installation station 242 and a hood and hatch assemblies station 244 in assembly zone 240, and a glass and windshields station 252 and a final preparation and controller removal station 254 in assembly zone 250. It should be understood that various parts and components are assembled onto the MVS 100 at each of the stations such that an assembled vehicle 100A is provided when the MVS 100 exits assembly zone 250.

It should also be understood that during the assembly of the vehicle 100A, the transient data sensors 130 provide transient data to the onboard controller 120. Non-limiting examples of transient data include fluid level in a container assembled onto the MVS 100, pressure level in a container assembled onto the MVS 100, charge level of an electric battery of the MVS 100, resistance of a connection between two electrical components assembled onto the MVS 100, operation information of data of a component assemble onto the MVS 100, among others. Accordingly, the transient data sensors 130 provide data on components assembled onto a given MVS 100, how a given MVS 100 is performing operational activities assembly information of a top hat being assembled onto the MVS 100 as the MVS 100 moves through one or more assembly zones.

Figure 5:
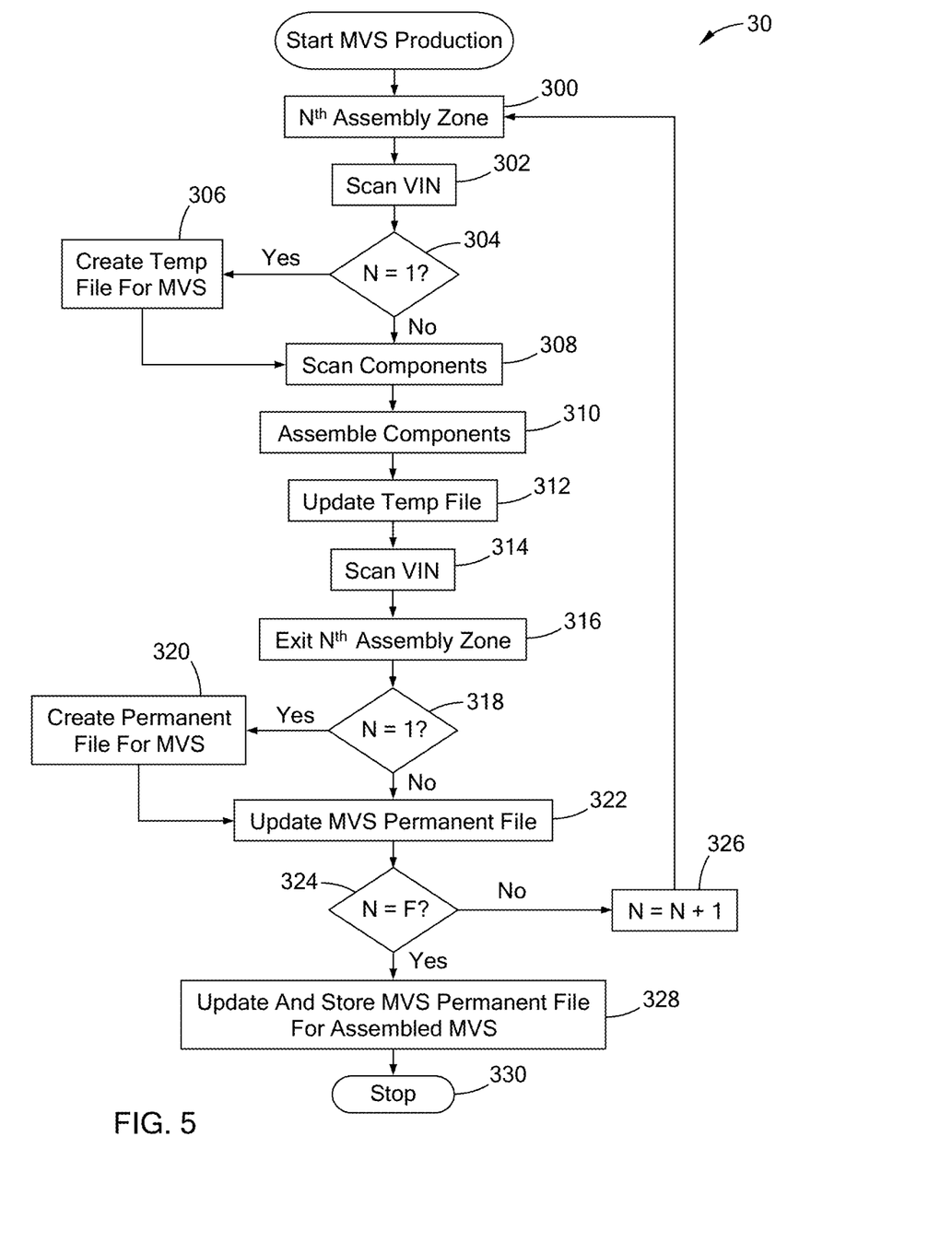
FIG. 5 is a flow chart for a method of creating a digital twin for a modular vehicle subassembly.

Referring now FIG. 5, a flow chart for a method 30 of creating a digital twin for a MVS 100 according to one form of the present disclosure is shown. Also, the method 30 is described below with reference to the first two assembly zones Z1 and Z1 in FIG. 1.

The method 30 includes starting production of a MVS 100 in a Nth assembly zone where N equals 1 at 300 (i.e., the first assembly zone Z1 in FIG. 1). The first assembly zone Z1 has components or parts to be assembled and at least one of the parts has a vehicle information number (VIN) for a vehicle to be manufactured with the parts. The VIN on the at least one part is scanned at 302 and the method 30 determines whether or not the Nth assembly zone is the first assembly zone Z1 at 304, i.e., whether or not N equals 1. For the first assembly zone Z1, N equals 1 and the method 30 proceeds to 306 where a MVS temporary digital file (referred to herein as "MVS temp digital file" or "MVS temp file") is created for the MVS 100 being assembled in the first assembly zone Z1. Stated differently, the method 30 scans the VIN on at least one component gathered or provided at the first assembly zone Z1 at 302 and then creates a MVS temp file for the MVS 100 being assembled and having the scanned VIN.

It should be understood that a VIN is an identifying code for a specific vehicle and no two vehicles in operation have the same VIN. In addition, the VIN identifies the model, components, accessories, among others, for the specific vehicle. Accordingly, the VIN scanned at 302 is a "blueprint" for the vehicle to be manufactured in that the scanned VIN determines which components, accessories, among others, are to be assembled onto the specific or given MVS 100. After the MVS temp file for the MVS 100 is created at 306, additional components gathered in the first assembly zone Z1 are scanned at 308 and assembled at 310.

Accordingly, and with reference to FIGS. 1 and 2A, the plurality of frame components 112 are gathered or provided in assembly zone Z1 at 300 and the VIN on at least one of the frame components 112 is scanned at 302. A MVS temp file for the MVS 100 being assembled is created at 306, the remainder of the frame components 112 are scanned at 308, and the frame components 112 are assembled in the assembly zone Z1 at 310 such that the frame 110 is provided. In addition, a cooling plate 114 is scanned at 308 and assembled onto the frame 110 in the assembly zone Z1.

It should be understood that scanning a component provides information on the component, such information including but not limited to a manufacturing history of the component, a part number of the component, a physical property of the component, a chemical property of the component, a geometric property of the component, among others. In addition, scanning of the components at 308 and scanning of other components discussed below, includes scanning at least one of a bar code, a data matrix, a quick response code, among others, of each of the components. In the alternative, or in addition to, scanning of the components includes a 2D camera scan of a predefined portion or all of one or more of the components, a 3D camera scan of a predefined portion or all of one or more of the components, a laser scan of a predefined portion or all of one or more of the components, an electrical conductivity or resistance scan measurement of a predefined portion or all of one or more of the components, an electrical capacitance scan or measurement of a predefined portion or all of one or more of the components, among others.

During and/or after the components are assembled at 310, the MVS temp file is updated at 312, and in some variations, the VIN is scanned again at 314 before the assembled components (e.g., the frame 110 with the cooling plate 114) exit the first assembly zone at 316. The method 30 proceeds to 318 and determines again whether or not N equals 1 at 318, and thus whether or not the components assembled at 310 have exited the first assembly zone Z1. For the example given, the frame 110 with the cooling plate 114 exits the first assembly zone Z1, N equals 1, and the method 30 creates a permanent digital file (referred to herein as "MVS permanent digital file" or "MVS permanent file") for the partially assembled MVS 100 having the VIN scanned at 320. The MVS permanent file is updated at 322, e.g. with data from the MVS temp file updated at 312, and the method 30 proceeds to 324 and determines whether or not N=F where F is the final assembly station on the assembly line (e.g., in FIG. 1 F=7). When N is not equal to F, the method 30 proceeds to 326 where N is incremented by 1 (e.g., N=2) before returning to 300.

The method 30 scans the VIN of the partially assembled MVS 100 now positioned in the second assembly zone Z2 at 302 and proceeds to 304 where the method 30 determines that N does not equal 1. Accordingly, the method proceeds to 308 where one or more of the gathered components of the propulsion system 160 in the second assembly zone Z2 are scanned. The components of the propulsion system 160 are assembled onto the frame 110 with the cooling plate 114 at 310, the MVS temp file is updated again at 312, and in some variations the VIN is scanned again at 314 before the partially assembled MVS 100 exits the second assembly zone at 316.

The method proceeds to 318 and determines N is not equal to 1. Accordingly, the method 30 proceeds to 322 and updates the MVS permanent file (again) at 322 with the MVS temp file updated at 312. At 324 the method determines N is not equal to F and proceeds to 326 where N is incremented by 1 (e.g., N=3 before returning to 300. This cycle, i.e., 300-326, continues until N=F at 324 and the MVS 100 has been assembled. Then the method 30 proceeds to 328 where the MVS permanent file for the assembled MVS 100 having the scanned VIN is updated and permanently stored before stopping at 330.

Figure 6:
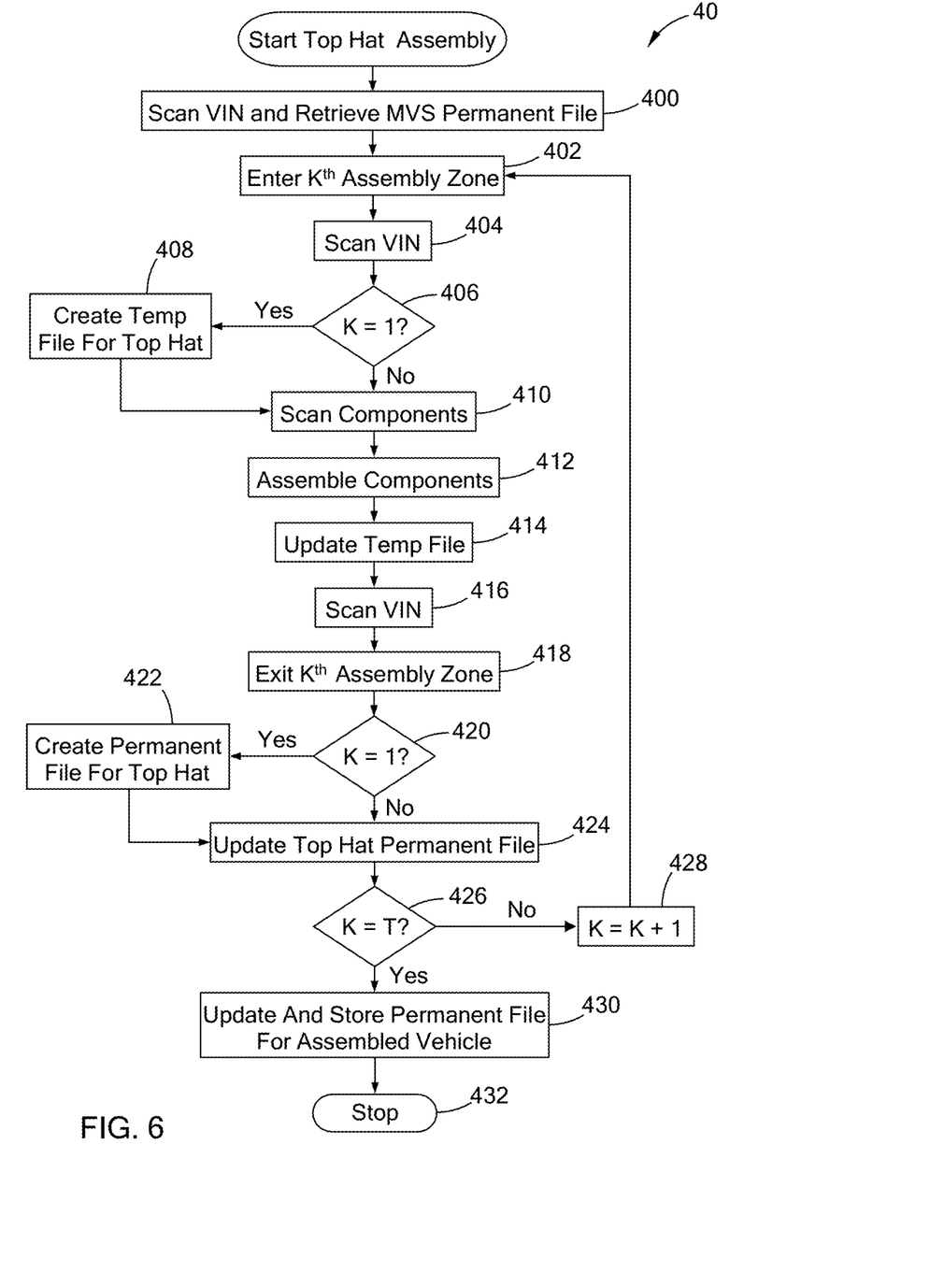
FIG. 6 is a flow chart for a method of creating a digital twin for a motor vehicle with a top hat assembled onto a modular vehicle subassembly.

Referring now FIG. 6, a flow chart for a method 40 of creating a digital twin for a motor vehicle 100A (FIG. 4) according to one form of the present disclosure is shown. Also, the method 40 is described below with reference to FIG. 4.

The method 40 includes starting production of the motor vehicle 100A by scanning the VIN of a MVS 100 and retrieving the MVS permanent file for the MVS 100 with the scanned VIN at 400. As discussed above, the VIN provides a blueprint, and particularly with reference to method 40, a blueprint of the top hat components and top hat accessories to be assembled onto the MVS 100.

The MVS 100 enters a $K^{th}$ assembly zone where K equals 1 at 402 (i.e., the first assembly zone 210 in FIG. 4) and the first assembly zone 210 has top hat components or parts (e.g., top hat structural and electrical distribution system (EDS) components) to be assembled onto the MVS 100. The VIN on the at least one part and/or the VIN of the MVS 100 is scanned at 404 and the method 40 determines whether or not the Kth assembly zone is the first assembly zone 210 at 406, i.e., whether or not K equals 1. For the first assembly zone 210, K equals 1 and the method 40 proceeds to 408 where a top hat temp digital file (referred to herein as a "TH temp file") is created for the top hat (with the assigned VIN) to be assembled on the MVS 100 in the vehicle assembly facility 20.

The method 40 proceeds to 410 where the top hat components in the first assembly zone 210 are scanned and then assembled onto the MVS at 412. During and/or after the components are assembled at 412, the TH temp file is updated at 414, and in some variations, the VIN is scanned again at 416 before the MVS 100 with the assembled top hat components provided in the first assembly zone 210 (referred to herein as "MVS 100 with the assembled first zone components") exits the first assembly zone 210 at 418. In some variations, the updated TH temp file includes some or all of the data from the MVS permanent file retrieved at 400.

The method 40 proceeds to 420 and determines again whether or not K equals 1 and thus whether or not the MVS 100 with the assembled first zone components has exited the first assembly zone 210. For the example given, the MVS 100 with the assembled first zone components exits the first assembly zone 210, K equals 1, and the method 40 creates a permanent digital file for the MVS 100 with the assembled first zone components (referred to herein as "TH permanent digital file" or "TH permanent file") at 422 and updates the TH permanent file at 424, e.g. with data from the TH temp file updated at 414. The method 40 proceeds to 426 and determines whether or not N=T where T is the total number of assembly zones on the assembly line (e.g., in FIG. 4 T=5). When N is not equal to T, the method 40 proceeds to 428 where K is incremented by 1 (e.g., K=2) before returning to 402.

The method 40 scans the VIN of the MVS 100 with the assembled first zone components now positioned in the second assembly zone 220 at 404 and proceeds to 406 where the method 40 determines that K does not equal 1. Accordingly, the method 40 proceeds to 410 where one or more of the gathered components in the second assembly zone 220 is scanned. The components in the second assembly zone 220 are assembled onto the MVS 100 with the assembled first zone components at 412 (referred to herein as the "MVS 100 with the assembled second zone components"), the TH temp file is updated again at 414, and in some variations the VIN is scanned again at 416 before the MVS 100 with the assembled second zone components exits the second assembly zone at 418.

The method 40 proceeds to 420 and determines K is not equal to 1. Accordingly, the method 40 proceeds to 424 and updates the TH permanent file (again) at 424 with the TH temp file updated at 414. At 426 the method determines K is not equal to T and proceeds to 428 where K is incremented by 1 (e.g., K=3 before returning to 402. This cycle, i.e., 402-428, continues until N=Tat 426 and the vehicle 100A has been assembled. Then the method 40 proceeds to 430 where the TH permanent file for the vehicle 100A having the scanned VIN is updated and permanently stored before stopping at 432.

It should be understood that in some variations the method 30 and the method 40 are combined such that a method for creating a digital twin for a vehicle includes using and combining a digital twin for an assembled MVS 100 and a digital twin for a top hat assembled on the MVS 100. That is, in some variations the digital twin created for a MVS 100 via method 30 and the digital twin for the top hat assembled on the MVS via method 40 are combined and stored as a single digital file. However, in other variations the digital twin created for a MVS 100 via method 30 and the digital twin for the top hat assembled on the MVS via method 40 are stored as separate digital files. And in at least one variation the digital twin created for a MVS 100 via method 30 and the digital twin for the top hat assembled on the MVS via method 40 are stored as separate digital files and combined to create and store as a single digital file. It should also be understood that in some variations the MVS assembly facility Z and the vehicle assembly facility 20 are combined into a MVS/vehicle assembly facility (e.g., a single assembly facility) and the method 30 and the method 40 are combined to create digital twins for vehicles assembled at the MVS/vehicle assembly facility.

Figure 7:
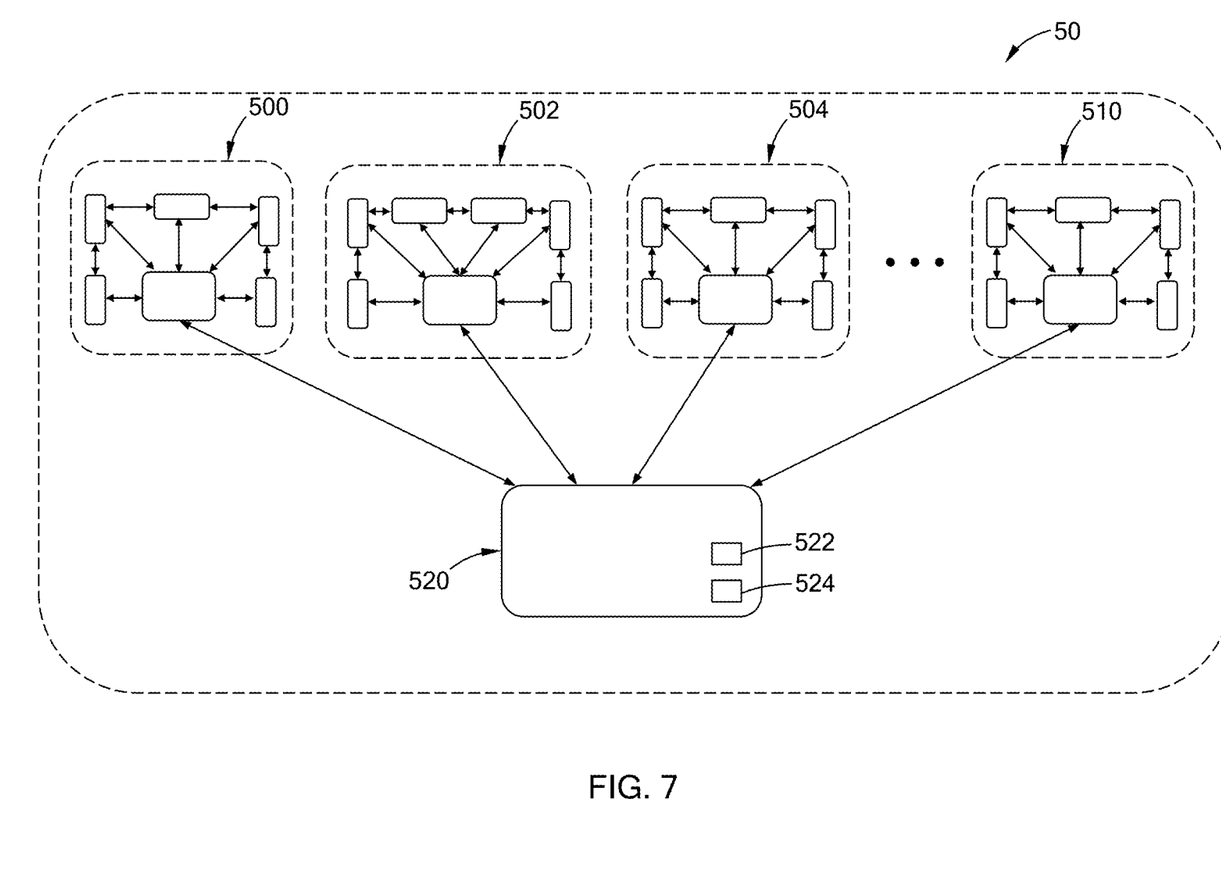
FIG. 7 is a block diagram of a system for creating and sharing digital twins for a plurality of vehicles with a plurality of top hats assembled onto a plurality of modular vehicle subassemblies.

Referring to FIG. 7, a system 50 or creating, storing, and transferring data twins for MVSs and vehicles is shown. The system includes a plurality of MVS and/or vehicle assembly facilities 500, 502, 504, . . . 510 and a global level management system 520 with memory 522 and at least one processor 524. It should be understood that the plurality of MVS and/or vehicle assembly facilities 500-510 are configured for the assembly of MVSs and/or top hats onto MVSs as described above with respect to FIGS. 1 and 4. It should also be understood that the digital twins for the MVSs and vehicles assembled at the plurality of MVS and/or vehicle assembly facilities 500-510 are created as described above with respect to FIGS. 5 and 6. The digital twins are transferred to the global level management system 520, stored in the memory 522, and in some variations analyzed or used by the at least processor 524. For example, in at least one variation the at least one processor 524 calculates or executes simulations of one or more MVSs and/or vehicles using a digital twin of the one or more MVSs and/or vehicles, respectively.

In some variations one or more of the digital twins stored in the memory 522 are transferred to one or more of the MVS and/or vehicle assembly facilities 500-510. For example, digital twins for MVSs assembled at a MVS assembly facility 500 are created, transferred to and stored in the memory 524 of the global management system 520, and then transferred to a vehicle assembly facility 510 where top hats are assembled onto the MVSs.

Unless otherwise expressly indicated herein, all numerical values indicating mechanical/thermal properties, compositional percentages, dimensions and/or tolerances, or other characteristics are to be understood as modified by the word "about" or "approximately" in describing the scope of the present disclosure. This modification is desired for various reasons including industrial practice, material, manufacturing, and assembly tolerances, and testing capability.

As used herein, the phrase at least one of A, B, and C should be construed to mean a logical (A OR B OR C), using a non-exclusive logical OR, and should not be construed to mean "at least one of A, at least one of B, and at least one of C."

In this application, the term "controller", "processor", and/or "module" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components (e.g., op amp circuit integrator as part of the heat flux data module) that provide the described functionality; or a combination of some or all of the above, such as in a system-on-chip.

The term memory is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory, tangible computer-readable medium are nonvolatile memory circuits (such as a flash memory circuit, an erasable programmable read-only memory circuit, or a mask read-only circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

The apparatuses and methods described in this application may be partially or fully implemented by a special purpose computer created by configuring a general-purpose computer to execute one or more particular functions embodied in computer programs. The functional blocks, flowchart components, and other elements described above serve as software specifications, which can be translated into the computer programs by the routine work of a skilled technician or programmer.

The description of the disclosure is merely exemplary in nature and, thus, variations that do not depart from the substance of the disclosure are intended to be within the scope of the disclosure. Such variations are not to be regarded as a departure from the spirit and scope of the disclosure.

What is claimed is:

1. A method for creating a digital twin for a vehicle assembled on at least one assembly line, the method comprising:
 a) at least one of starting assembly of a pre-assembled modular vehicle subassembly (MVS) in a Nth MVS assembly zone of an MVS assembly line having a plurality of MVS assembly zones by assembling Nth assembly zone components, and moving the pre-assembled MVS into the Nth MVS assembly zone and assembling Nth assembly zone components onto the pre-assembled MVS, wherein N=1, 2, 3, . . . Z1 and Z1 equals a total number of the plurality of MVS assembly zones;
 b) scanning a vehicle identification number (VIN) and at least one of the Nth assembly zone components and acquiring scanned data, and storing the scanned data in a MVS temporary digital file assigned to the pre-assembled MVS, wherein N=1, 2, 3, . . . Z1 and Z1 equals a total number of the plurality of MVS assembly zones;
 c) updating a MVS permanent digital file assigned to the pre-assembled MVS;
 d) incrementing N by 1;
 e) repeating steps a) through d) until N equals Z1 and the pre-assembled MVS is a MVS;
 f) storing the MVS permanent digital file when N equals Z1
 g) moving the MVS into a Kth assembly zone of a top hat (TH) assembly line having a plurality of TH assembly zones and assembling Kth assembly zone components onto the MVS, scanning at least the Kth assembly zone components and acquiring TH scanned data, and storing the TH scanned data in a TH temporary digital file assigned to the MVS, wherein K=1, 2, 3, . . . Z2 and Z2 equals a total number of the plurality of TH assembly zones;
 h) scanning the VIN and retrieving the MVS permanent digital file;
 i) moving the assembled MVS into a Kth assembly zone and creating a TH temporary digital file for the TH being assembled on the MVS when K=1;
 j) assembling TH components onto the MVS in the Kth assembly zone, wherein the TH components are scanned;
 k) updating the TH temporary digital file such that data on the scanned TH components and the TH being assembled are stored in the TH temporary digital file;

l) scanning the VIN, moving the TH being assembled out of the Kth assembly zone, and creating a TH permanent digital file for the TH being assembled when N=1;

m) updating a TH permanent digital file assigned to the MVS;

n) incrementing K by 1;

o) repeating steps q) through i) until K equals Z2 and the TH is assembled on the MVS and the vehicle is manufactured; and p) storing the TH permanent digital file when K equals Z2.

2. The method according to claim 1 further comprising scanning a vehicle identification number (VIN) for the pre-assembled MVS in the Nth MVS assembly zone.

3. The method according to claim 2, wherein the VIN for the pre-assembled MVS in the Nth MVS assembly zone is scanned when the pre-assembled MVS moves into the Nth MVS assembly zone and when the pre-assembled MVS moves out of the Nth MVS assembly zone.

4. The method according to claim 1 further comprising creating the MVS temporary digital file before the pre-assembled MVS moves out of the N=1 MVS assembly zone.

5. The method according to claim 1 further comprising creating the MVS permanent digital file before the pre-assembled MVS moves out of the N=1 MVS assembly zone.

6. The method according to claim 1 further comprising scanning a vehicle identification number (VIN) of the pre-assembled MVS in the Nth MVS assembly zone before assembling the Nth assembly zone components onto the pre-assembled MVS and scanning the VIN of the pre-assembled MVS in the Nth MVS assembly zone after assembling the Nth assembly zone components onto the pre-assembled MVS.

7. The method according to claim 1, wherein the MVS permanent digital file is updated after the Nth assembly zone components are assembled onto the pre-assembled MVS in the Nth assembly zone.

8. The method according to claim 1 further comprising scanning a vehicle identification number (VIN) of the MVS in the Kth assembly zone before assembling the Kth assembly zone components onto the MVS and scanning the VIN of the MVS in the Kth assembly zone after assembling the Kth assembly zone components onto the MVS in the Kth assembly zone.

9. The method according to claim 1 further comprising creating the TH temporary digital file before the MVS moves out of the K=1 TH assembly zone.

10. The method according to claim 1, wherein the TH permanent digital file comprises the MVS permanent file updated with the TH scanned data.

11. The method according to claim 10, wherein the MVS permanent file is downloaded onto a central management system for the TH assembly line prior to being updated with the TH scanned data.

12. The method according to claim 1 further comprising scanning a vehicle identification number (VIN) of the MVS in the Kth assembly zone of the TH assembly line before assembling the Kth assembly zone components onto the MVS and scanning the VIN of the MVS in the Kth assembly zone of the TH assembly line after assembling the Kth assembly zone components onto the MVS.

13. The method according to claim 1, wherein the TH permanent digital file is updated after the Kth assembly zone components are assembled onto the MVS in the Kth assembly zone.

14. The method according to claim 1 further comprising:

q) scanning the VIN of the MVS in the Kth assembly zone before assembling the Kth assembly zone components onto the MVS and scanning the VIN of the MVS in the Kth assembly zone after assembling the Kth assembly zone components onto the MVS in the Kth assembly zone.

15. A method for creating a digital twin for a vehicle assembled on at least one assembly line, the method comprising:

a) at least one of starting assembly of a pre-assembled modular vehicle subassembly (MVS) in a N=1 MVS assembly zone of an MVS assembly line having a plurality of MVS assembly zones by assembling Nth assembly zone components, and moving the pre-assembled MVS into the Nth MVS assembly zone assembling Nth assembly zone components onto the pre-assembled MVS, wherein N=1, 2, 3, . . . Z1 and Z1 equals a total number of the plurality of MVS assembly zones;

b) scanning a vehicle identification number (VIN), at least one of the Nth assembly zone components, and acquiring scanned data, and storing the scanned data in a MVS temporary digital file assigned to the pre-assembled MVS, wherein N=1, 2, 3, . . . Z1 and Z1 equals a total number of the plurality of MVS assembly zones;

c) updating a MVS permanent digital file assigned to the pre-assembled MVS;

d) incrementing N by 1;

e) repeating steps a) through d) until N equals Z1 and the pre-assembled MVS is a MVS;

f) storing the MVS permanent digital file when N equals Z1;

g) moving the MVS into a Kth assembly zone of a top hat (TH) assembly line having a plurality of TH assembly zones and assembling Kth assembly zone components onto the MVS, scanning at least the Kth assembly zone components and acquiring TH scanned data, and storing the TH scanned data in a TH temporary digital file assigned to the MVS, wherein K=1, 2, 3, . . . Z2 and Z2 equals a total number of the plurality of TH assembly zones;

h) scanning the VIN and retrieving the MVS permanent digital file;

i) moving the assembled MVS into a Kth assembly zone and creating a TH temporary digital file for the TH being assembled on the MVS when K=1;

j) assembling TH components onto the MVS in the Kth assembly zone, wherein the TH components are scanned;

k) updating the TH temporary digital file such that data on the scanned TH components and the TH being assembled are stored in the TH temporary digital file;

l) scanning the VIN, moving the TH being assembled out of the Kth assembly zone, and creating a TH permanent digital file for the TH being assembled when N=1;

m) updating a TH permanent digital file assigned to the MVS;

n) incrementing K by 1;

o) repeating steps g) through i) until K equals Z2 and the TH is assembled on the MVS and the vehicle is manufactured;

p) storing the TH permanent digital file when K equals Z2 q) creating the MVS temporary digital file before the pre-assembled MVS moves out of the N=1 MVS assembly zone;

r) creating the MVS permanent digital file before the pre-assembled MVS moves out of the N=1 MVS assembly zone;

s) creating the TH temporary digital file before the MVS moves out of the K=1 TH assembly zone;
t) downloading the MVS permanent digital file onto a central management system for the TH assembly line; and
u) updating the MVS permanent digital file with the TH scanned data.

16. The method according to claim 15, wherein the scanned data comprises transient data of the pre-assembled MVS, the transient data comprising at least one performance data of the MVS, at least one trouble code of the MVS, assembly testing data of the MVS, and over-the-air programming information of the MVS.

17. A method for creating a digital twin for a vehicle being assembled by moving assembled components of the vehicle through N=1, 2, 3, . . . Z1 modular vehicle subassembly (MVS) assembly zones, where Z1 equals a total number of the MVS assembly zones on a MVS assembly line, the method comprising:
   a) scanning a vehicle identification number (VIN) for a pre-assembled MVS in an Nth assembly zone;
   b) creating a MVS temporary digital file for the pre-assembled MVS when N=1;
   c) scanning Nth assembly zone components and acquiring MVS component scanned data;
   d) assembling the Nth assembly zone components onto the pre-assembled MVS in the Nth assembly zone;
   e) updating the MVS temporary digital file with the MVS component scanned data;
   f) scanning the VIN, moving the pre-assembled MVS out of the Nth assembly zone, and creating a MVS permanent digital file for the MVS being assembled when N=1;
   g) updating the MVS permanent digital file with the MVS component scanned data;
   h) incrementing N by 1;
   i) repeating steps a) through h) until N equals Z1 and the pre-assembled MVS is a MVS;
   j) storing the MVS permanent digital file when N=Z1;
   k) moving the MVS into a Kth assembly zone of a top hat (TH) assembly line having a plurality of TH assembly zones and assembling Kth assembly zone components onto the MVS, scanning at least the Kth assembly zone components and acquiring TH scanned data, and storing the TH scanned data in a TH temporary digital file assigned to the MVS, wherein K=1, 2, 3, . . . Z2 and Z2 equals a total number of the plurality of TH assembly zones;
   l) scanning the VIN and retrieving the MVS permanent digital file;
   m) moving the assembled MVS into a Kth assembly zone and creating a TH temporary digital file for the TH being assembled on the MVS when K=1;
   n) assembling TH components onto the MVS in the Kth assembly zone, wherein the TH components are scanned;
   o) updating the TH temporary digital file such that data on the scanned TH components and the TH being assembled are stored in the TH temporary digital file;
   p) scanning the VIN, moving the TH being assembled out of the Kth assembly zone, and creating a TH permanent digital file for the TH being assembled when N=1;
   q) updating the TH permanent digital file with the stored data in the TH temporary digital file;
   r) incrementing K=K+1 when K is less than Z2 and moving the MVS being assembled into a subsequent Kth assembly zone, wherein Z2 equals a total number of the TH assembly zones on the TH assembly line;
   s) repeating steps k) through r) until K equals Z2 and the TH is assembled on the MVS; and
   t) updating and storing the TH plus MVS permanent digital file when K=Z2.

* * * * *